United States Patent [19]
Holcombe

[11] Patent Number: 5,864,591
[45] Date of Patent: Jan. 26, 1999

[54] APPARATUS AND METHOD FOR SUPPRESSION OF FEEDBACK IN A COMMUNICATIONS RECEIVER

[75] Inventor: Wayne T. Holcombe, Palo Alto, Calif.

[73] Assignee: Integration Associates, Inc., Mountain View, Calif.

[21] Appl. No.: 827,402

[22] Filed: Mar. 27, 1997

[51] Int. Cl.$^6$ .............................. H04L 27/08; H04B 1/06; H04B 10/06
[52] U.S. Cl. ...................... 375/345; 455/234.1; 359/194
[58] Field of Search ........................ 375/317, 318, 375/340, 345, 346; 455/219, 232.1, 234.1, 239.1, 245.1, 252.1; 359/152, 153, 161, 194; 329/311, 350

[56] References Cited

U.S. PATENT DOCUMENTS

| | | | |
|---|---|---|---|
| 4,241,455 | 12/1980 | Eibner | 359/194 |
| 4,528,519 | 7/1985 | Van Driest | 330/279 |
| 4,757,502 | 7/1988 | Meuriche et al. | 370/318 |
| 5,081,653 | 1/1992 | Saito | 375/345 |
| 5,329,115 | 7/1994 | Lim | 250/214 R |
| 5,361,395 | 11/1994 | Yamamoto | 455/436 |
| 5,557,634 | 9/1996 | Balasubramanian | 375/222 |
| 5,760,942 | 6/1998 | Bryant | 359/193 |

OTHER PUBLICATIONS

Ernesto Perea "Technology Directions; Optical Interconnects, High Temperature, & Packaging" Feb. 10, 1996, ISSCC96, 8 pages.
IBM Microelectronics "Infrared Transceiver Module—IBM31T1101" Nov. 6, 1996, http:///www.chips.ibm.com.
Temic Semiconductors "TFDS 6000 Integrated Infrared Transceiver Module IrDA" Aug. 1996, 12 pages.
Hewlett–Packard "Infrared Transceiver Preliminary Technical Data HSDL–1100" Nov. 17, 1995.
Novalog, Inc. "SIRFIR™ 4Mbps IrDA Transceiver" Apr. 1996 info@novalog.com.
Dr. Keming W. Yeh and Dr. Lichen Wang "An Introduction to the IrDA Standard and System Implementaiton" *Wireless System Design* May 1996, 11 pages.
Temic Semiconductors "IrDA Compatible Data Transmission" Apr. 1996, pp. 1–18.

*Primary Examiner*—Stephen Chin
*Assistant Examiner*—Jeffrey W. Gluck
*Attorney, Agent, or Firm*—Marger, Johnson & McCollom, P.C.

[57] ABSTRACT

A receiver circuit and method wherein an automatic gain control circuit of the receiver is isolated from the input to the receiver in response to the output signal from the receiver in order to suppress the effect of feedback from the output signal to the input of the receiver.

23 Claims, 12 Drawing Sheets

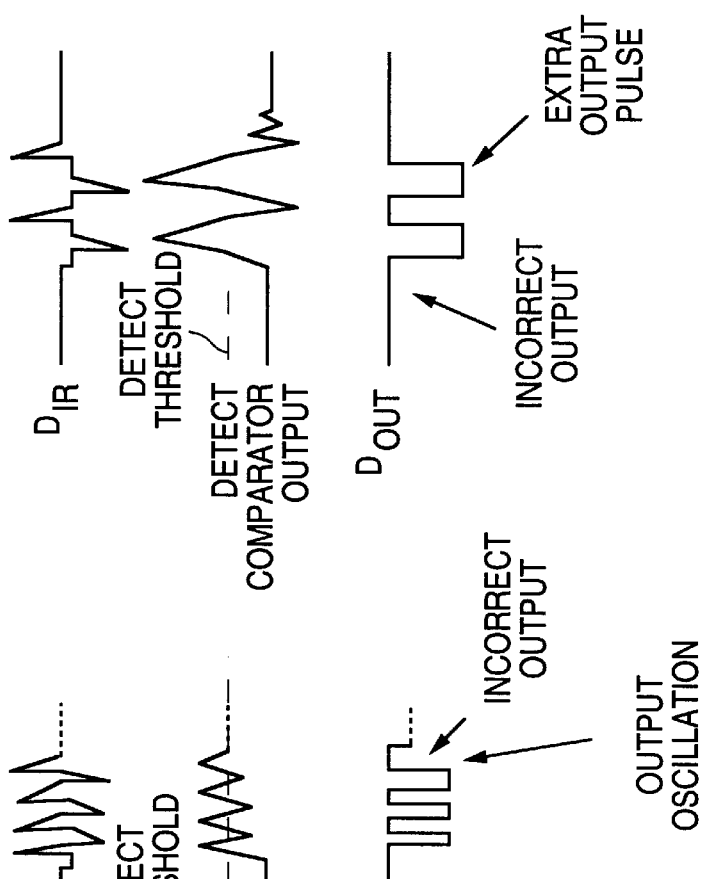

APPARATUS AND METHOD FOR SUPPRESSION OF FEEDBACK IN A COMMUNICATIONS RECEIVER

BACKGROUND OF THE INVENTION

The present invention relates to a data receiver and method for reducing the effect of feedback from an output signal of the receiver to an input to the receiver.

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls and therefore more useful in an office environment). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bidirectional communication, a receiver and transmitter at each end is required. A combined transmitter and receiver is called a transceiver.

In typical high volume applications, it is now standard practice to fabricate the receiver circuitry and transmitter driver in a single integrated circuit (IC) to produce a transceiver IC. In turn, a transceiver IC, infrared photodiode and LED along with lenses for the photodiode and LED are assembled together in a plastic molded package designed to be small in size and allow placement in the incorporating electronic device so as to have a wide angle of view (typically through an infrared window on its case). The transceiver IC is designed to digitally interface to some type of serial data communications device such as an Infrared Communication Controller (ICC), UART, USART, or a microprocessor performing the same function.

A representative example of a conventional infrared data transmitter and receiver pair is shown in FIG. 1. Infrared transmitter 10 includes LED 16 which generates a modulated infrared pulse in response to transistor 14 being driven by the input data signal $D_{IN}$. The modulated infrared signal is optically coupled to an infrared detector, such as photodiode 24 normally operated in current mode (versus voltage mode) producing an output current which is a linear analog of the optical infrared signal falling on it. The infrared pulses generated by LED 16 strike photodiode 24 causing it to conduct current responsive to the transmitted input data signal $D_{IN}$ thereby generating a received data signal at $D_{IR}$.

Data can be modulated on the infrared transmitted signal by any of a number of well known methods. Two of the most popular methods are defined by the Infrared Data Association (IrDA) and Sharp corporation (Sharp ASK). IrDA Physical Layer Link Specification 1.1e specifies two main physical layer infrared modulation methods. One method is a low-speed (2 Kbp/s to 1.15 Mbp/s) on-off infrared carrier asynchronous modulation where the presence of a pulse indicates a 0 bit and the absence of a pulse indicates a 1 bit. The second method is a high speed (4 Mb/s) synchronous Four Pulse Position Modulation (4PPM) method in which the time position of a 125 ns infrared pulse in a 500 ns frame encodes two bits of information. The Sharp ASK method is similar to the low speed IrDA method but also modulates the infrared carrier with a 500 Khz signal to facilitate differentiating between a valid signal and ambient infrared signals.

In receiver 20, the received signal at $D_{IR}$ is transformed into a voltage signal and amplified by amplifier 26. The signal output from amplifier 26 then feeds into comparator 42 which demodulates the received signal by comparing it to a detection threshold voltage $V_{DET}$ in order to produce a digital output data signal at $D_{OUT}$.

The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ at the center of the received signal improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 na to 5 ma plus DC and AC currents arising from ambient infrared sources of sunlight, incandescent and florescent lighting. As a consequence, the center of the received signal waveform will vary, whereas $V_{DET}$ must generally be maintained at a constant level. To address this problem, receivers typically include an automatic gain control mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1–300 ua) signals and Automatic Gain Control (AGC) which improves both noise immunity and minimizes output pulse width variation with signal strength.

Because the typical infrared photodiode has a very small area its output current is low, typically 10 na to 200 na at ranges of 1 to 3 meters when receiving signals from an infrared LED driven by current pulses of 80 us to 125 ns, at levels of 50 ma to 500 ma. There are well known electronic methods for low noise amplification of such weak, wideband signals. However, a common problem of such amplification systems is significant disruptive feedback from the receiver output $D_{OUT}$ to the photodiode input $D_{IR}$. Others have recognized that feedback exists but have attributed it to substrate coupling and capacitive loading due to MIS capacitor parasitics (Ritter et al, "Circuit and System Challenges in IR Wireless Communication" ISSCC96, Session 25, TD: Optical Interconnects, High Temp., & Packaging, Paper 25.1). However, empirical observation revealed that the largest feedback mechanism is due to electrostatic coupling (capacitive), represented by capacitor 40 in FIG. 1, between the data output pin $D_{OUT}$ and received data input pin $D_{IR}$. Significant coupling can also occur on ground, power, and bias lines of receiver 20.

As an example, because an IC infrared receiver is preferably small, there is very close proximity (less than 1 cm.) between the input $D_{IR}$ from photodiode 24 and the receiver output, the output of comparator 42. Consequently, in infrared receiver 20 the electrostatic coupling (feedback) between these two signal paths is typically from 5 to 50 femto farads (fF) capacitance (capacitor 40). In addition, there may be added capacitive coupling to the photodiode input $D_{IR}$ from the receiver output signal trace on the circuit board on which the receiver package is mounted. During receiver signal detection and subsequent output this feedback causes a large input spurious signal that disrupts moderate to weak received signals which may limit operation to distances under 1 meter in order to obtain received signal amplitudes sufficient to overcome the feedback signal.

The disruptive effect of feedback varies. For out of phase feedback, or where the receiver response has transient overshoot or ringing, then output pulse oscillations are likely to occur and may last beyond the duration of the input pulse, see FIGS. 2A–2C. Even if pulse oscillations do not occur on systems using AGC, the feedback transient may cause receiver gain reduction after some delay so that pulse detection drops occur.

Generally, to prevent significant disruption of the received signal it is desirable that the amplitude of the feedback or noise be at least 12 db less (¼) than the minimum amplitude of the received signal. Since the feedback signal is a narrow current transient arising from the fast differentiated edge (10–200 ns rise and fall time) of an output pulse in $D_{OUT}$, the feedback, after bandwidth filtering, appears at the receiver detect comparator 42 as an exponentially decaying pulse with a time constant equal to the receiver bandwidth time constant (which for good pulse fidelity is typically at least ½ the signal pulse width).

For example, if infrared receiver which has a typical value of 10 fF of feedback capacitance 40 and the voltage swing $D_{OUT}$ is 5V, then a 50 femto couloumb charge transient will be transferred to $D_{IR}$ on each transition of $D_{OUT}$. On a receiver designed to receive a 1.66 us pulse with good fidelity, this transient will appear as a 0.83 us, 60 na (50 fcoul) disrupting signal. On such a receiver, the input signal detect threshold $V_{DET}$ would need to be set at a level corresponding to a 240 nA current signal at the input $D_{IR}$ (approximately 240 mV in the present example) to avoid having the input signal be disrupted by feedback.

Another problem with the signal disruption of feedback is that if feedback exceeds the detect threshold, $V_{DET}$, then operation of receiver 20 even with a strong received signal level may fail. Typically this occurs because although a strong signal may overpower feedback from the leading edge of the transition on $D_{OUT}$, the trailing edge feedback may cause oscillations or extra pulses because it occurs after the trailing edge of the pulse in the received signal. Consequently, the $V_{DET}$ on infrared receiver 20 needs to be set to a higher lever (1.5–3 times) than is otherwise necessary to ensure that feedback does not cause receiver failure due to manufacturing variances or feedback variances due to the mounting circuit board trace layout. In the above example, to provide this variance margin, the detect threshold, $V_{DET}$, would need to be set to a reference level corresponding to an undesirably high input current level of 360 na to 720 na. With typical LED transmitters, this would result in a maximum receiving range of ½ meter or less.

Low cost, small photodetectors produce 10 na–100 na of output in the typical operation range of 1–3 meters when illuminated by IrDA specified infrared transmitters. The feedback signal due to parasitic capacitance 40 will often be 20 to 30 dB greater in strength than the minimum received signal from the photodiode. Therefore, it is desirable to reduce the effects of capacitive feedback from the receiver output to photodetector input $D_{IR}$ by 20 to 40 db (0.1 to 0.01 times).

One conventional solution for reducing the magnitude of capacitive feedback coupling is to use electrostatic shielding. A shield is a conductor terminated at local signal ground and placed close to or between the radiating and receiving signal conductors. A typical shield for moderate feedback attenuation (20 db reduction) is a proximity ground plane, while a typical shield for higher feedback attenuation (40 db reduction) is an enclosing conductive box with access holes for conductors and optical windows. Although the shield works well, it adds manufacturing cost and increases the size of a receiver or transceiver module.

Another conventional solution is to use a larger photodiode for photodetector 24. Although the increased area of the diode will tend to increase feedback capacitance the received signal will generally be increased by a greater amount than the feedback. However, such a large photodetector (having at least 10 times the active area of a small diode) is significantly more expensive than a small photodetector, and a large photodetector or photo transistor will not fit in a desirable small module.

Yet another known solution is to use differential input and output techniques as illustrated in FIGS. 3A and 3B. A differential input amplifier can reject common mode noise or feedback by over 40 db assuming the feedback noise is equal on both inputs of the differential input amplifier. However, this is typically not a valid assumption in an actual infrared receiver. This is because a single photodiode coupled across the inputs of the differential input amplifier will have significantly different feedback coupling capacitances due to the inherent asymmetric geometry of the two photodiode connections. Consequently, using a single photodiode with a differential input amplifier will typically not improve performance over a receiver with a non-differential amplifier.

Another differential solution is to use two receiver outputs that are 180° out of phase with one another, as illustrated in FIG. 3C. If they are placed symmetrically with respect to the photodiode input then each output tends to cancel the feedback due to the other output and feedback coupling can be reduced by a factor of ten. Although this solution is less expensive than the dual diode differential technique, it still suffers from the same undesirable layout symmetry constraints.

A better performing differential input amplifier method is to use two matched photodiodes with identical mounting geometries wherein one photodiode receives the transmitted infrared signal and the other photodiode has its light path covered, as shown in FIG. 3D. Although this differential solution can reduce feedback by an order of ten using the added diode, it is more expensive, larger in size and has the added mechanical constraint that the diode geometry needs to be symmetrical with respect to the receiver output conductor connection. In addition, the diode feedback symmetry may be disrupted due to asymmetric shielding effects of nearby conductors on the circuit board on which the receiver is mounted.

Accordingly, there remains a need for a method for addressing feedback in an infrared receiver to improve performance, but without the drawbacks of the conventional solutions.

SUMMARY OF THE INVENTION

The present invention relates to a receiver circuit having an input amplifier for receiving and amplifying an input signal where the input amplifier is further configured to vary the gain of the input amplifier responsive to a gain control signal, a bandpass filter for filtering the amplified input signal, a comparator for comparing the filtered input signal to a detection threshold voltage level in order to generate a digital output signal, a delay circuit for receiving the digital output signal and generating a delayed digital output signal responsive thereto, an automatic gain control circuit for comparing the filtered input signal to an automatic gain control threshold voltage and generating the gain control signal responsive thereto, an isolation control signal generator for generating an isolation control signal responsive to the delayed digital output signal; and an isolation switch for isolating the automatic gain control circuit from the amplified input signal responsive to the isolation control signal.

The present invention also relates to a method for suppressing feedback effects in a receiver by amplifying an input signal to produce an amplified input signal, controlling the gain of the input signal amplification responsive to the magnitude of the amplified input signal, comparing the amplified input signal to a detection threshold voltage to produce a digital data signal, and holding the gain at a substantially constant level in response to a fast signal transition in the digital output signal.

BRIEF DESCRIPTION OF THE DRAWINGS

FIGS. 2A–C are waveform diagrams illustrating the effects of feedback in a conventional infrared receiver.

DETAILED DESCRIPTION OF THE PRESENT INVENTION

Figure 1:
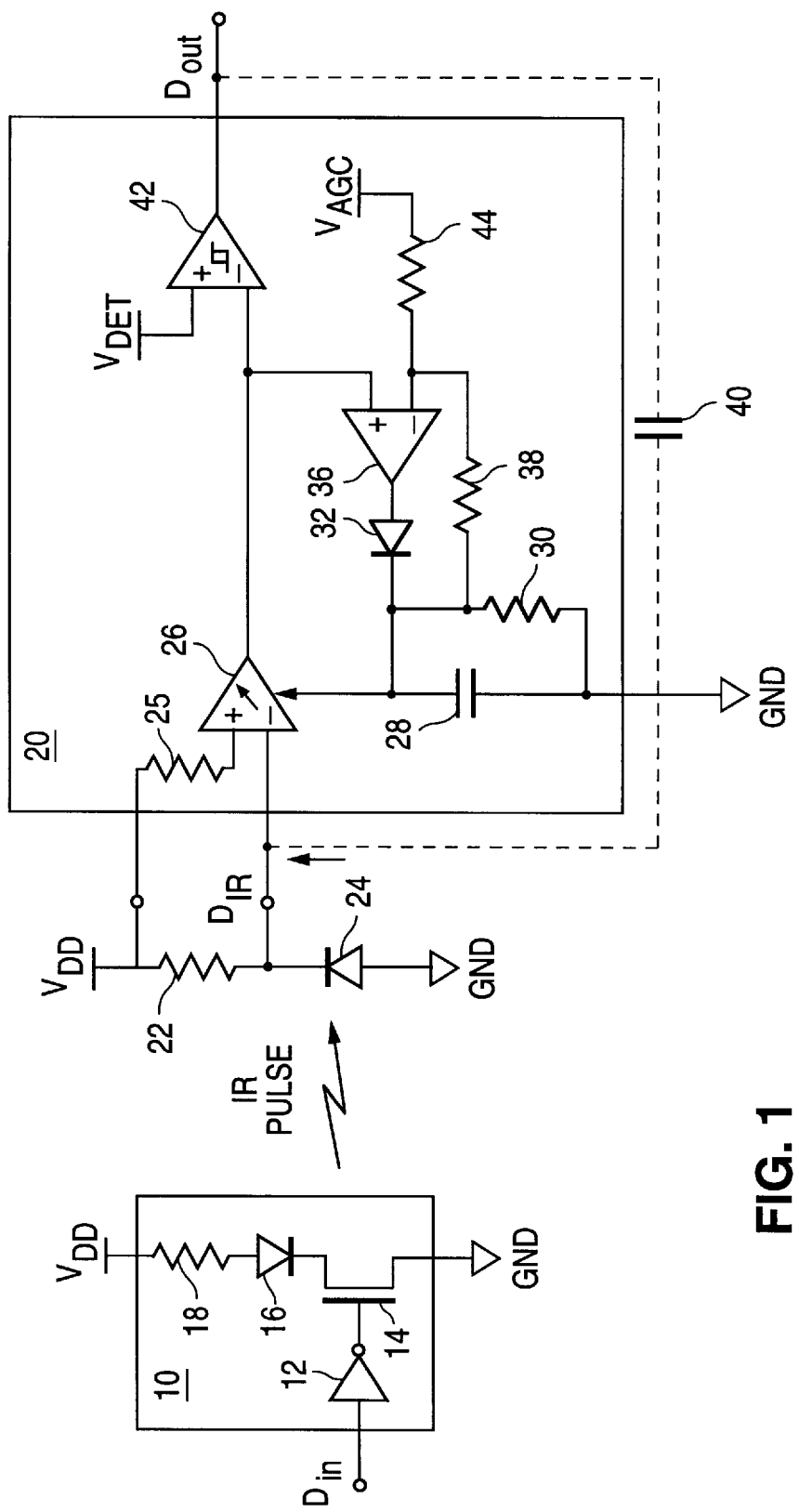
FIG. 1 is a circuit diagram of a conventional infrared transmitter receiver pair.
Figure 3A:
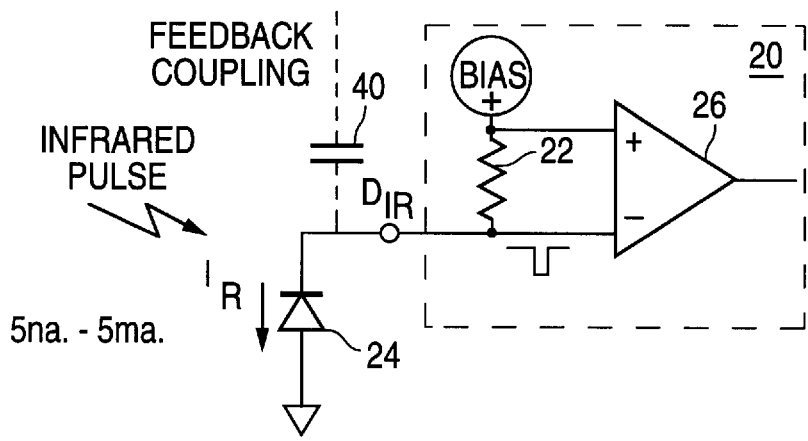
FIGS. 3A–D are circuit diagrams illustrating conventional techniques for mitigating feedback.
Figure 3B:
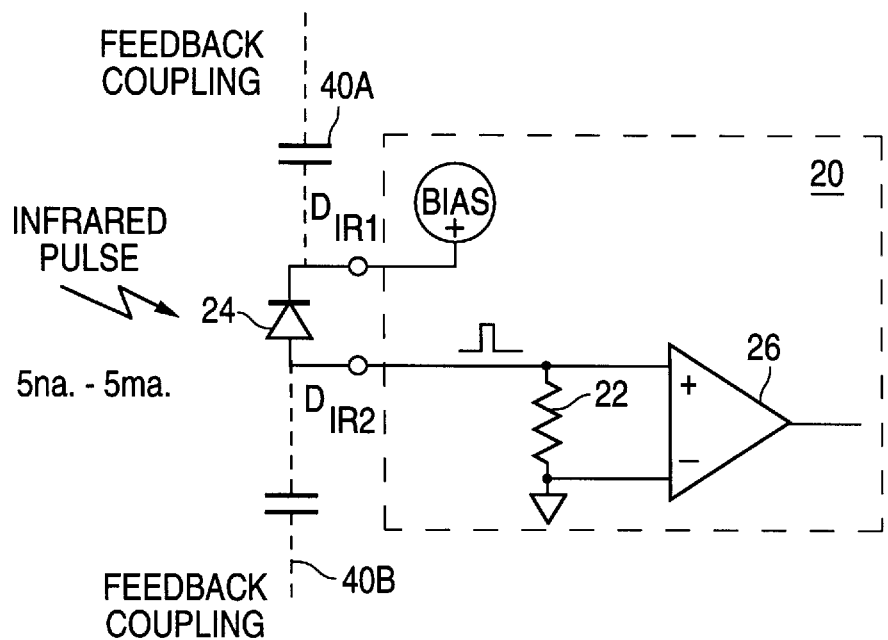
Figure 3C:
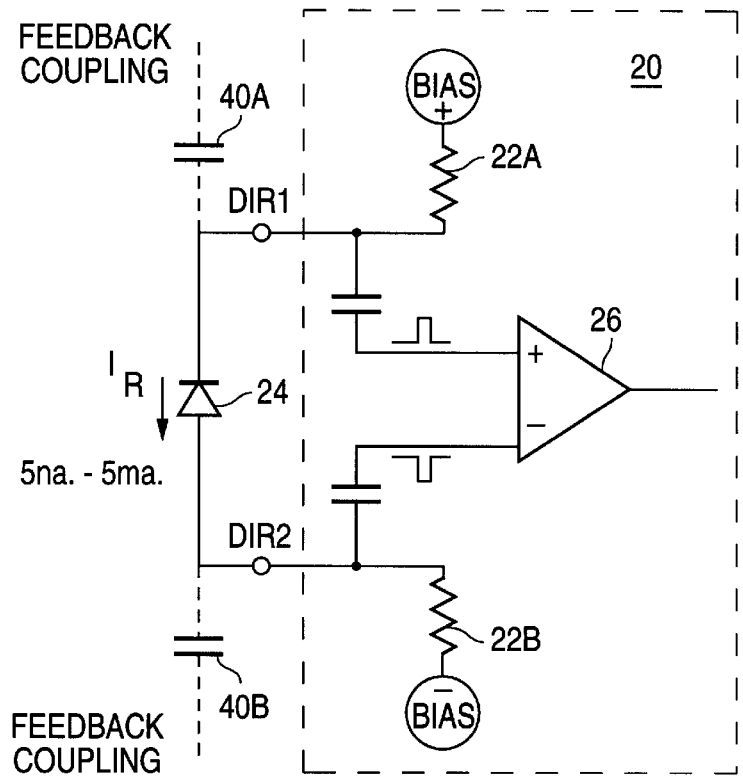
Figure 3D:
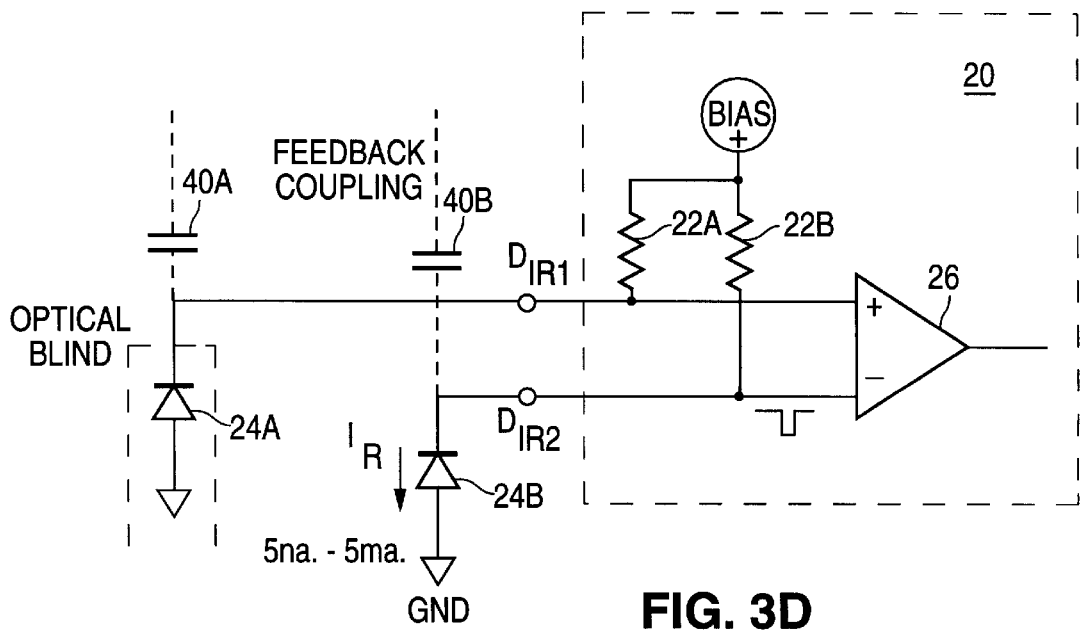
Figure 4:
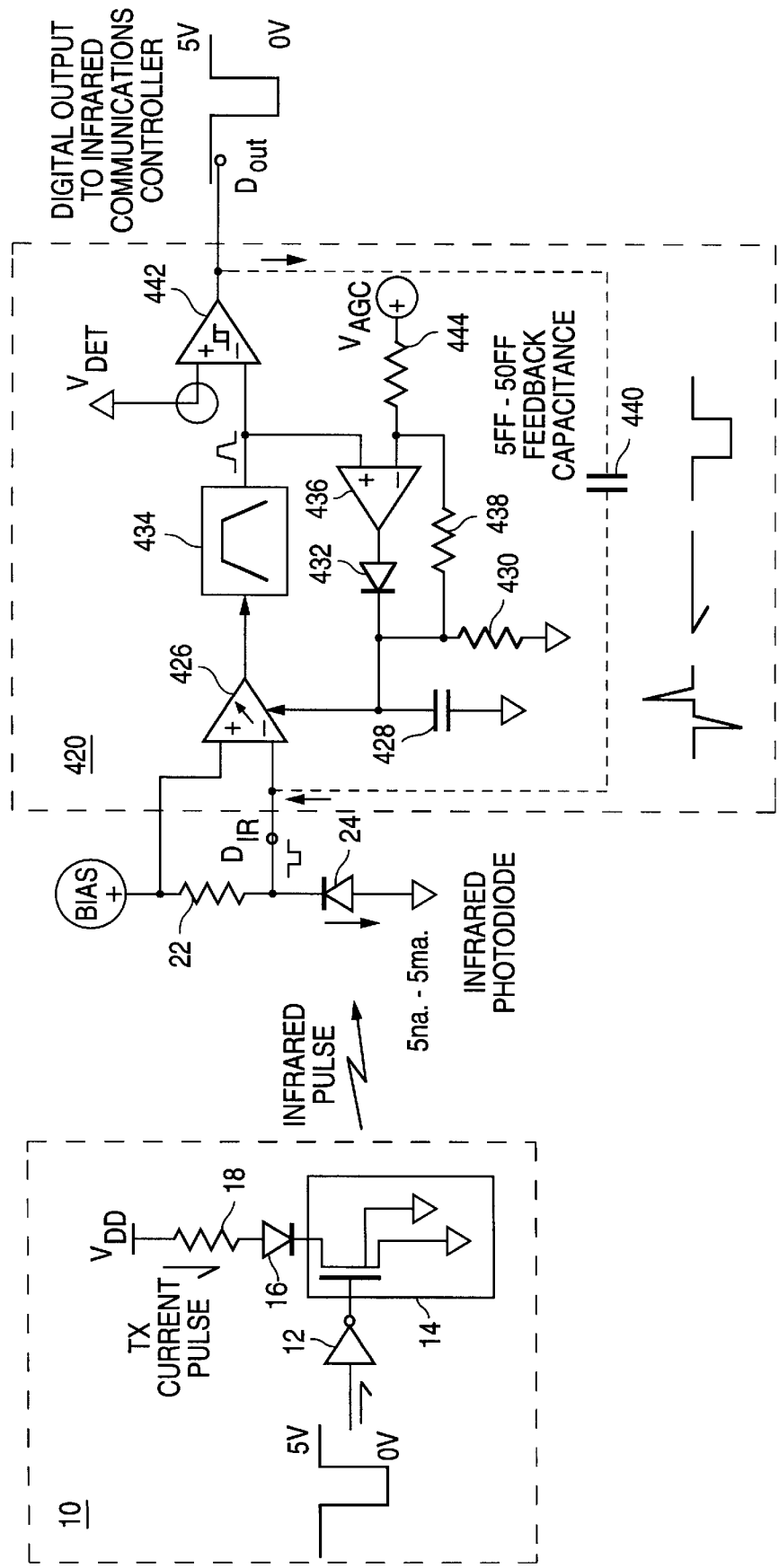
FIG. 4 is a circuit diagram of an embodiment of the present invention which utilizes positive feedback and first order bandwidth filtering.

FIG. 4 illustrates a circuit designed to mitigate the effects of feedback through control of the feedback phase with the design of the receiver bandwidth filter design. For infrared receivers which demodulate using on-off modulation (such as the modulation specified by IrDA), it is possible to receive signals significantly below the feedback transient amplitude provided that the feedback is in phase with the received signal. This is accomplished by designing the receiver so that the feedback from the data output is positive such that the feedback actually reinforces the received signal because the polarity of the feedback spike corresponds to the polarity of the received signal. If the receiver transient response has little overshoot, and either no AGC or high signal threshold AGC is used, then the positive feedback acts as dynamic hysteresis, producing an output pulse without any spurious transitions.

The infrared receiver 420 of FIG. 4 is designed so that the feedback through parasitic capacitor 440 from $D_{OUT}$ to the photodiode input $D_{IR}$ is positive. Thus, as shown in FIG. 5A, a negative transition in the received signal at $D_{IR}$ results in a negative transition in the data output signal at $D_{OUT}$ which will, in turn, generate a corresponding negative spike in the feedback signal.

Figure 5:
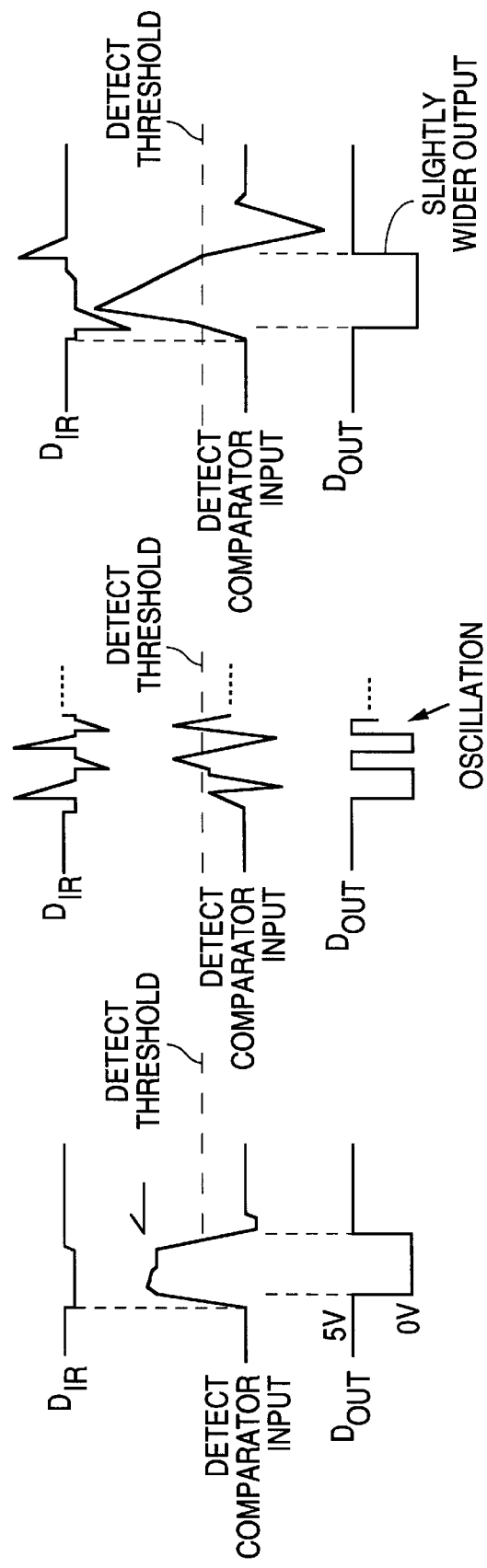
FIGS. 5A–C are waveform diagrams illustrating the behavior of the embodiment of the present invention shown in FIG. 4.

FIG. 5B demonstrates the resulting waveforms when negative feedback is combined with the received signal at $D_{IR}$. The received signal is countered by the much larger amplitude of the feedback spike which causes the signal at the input of detect comparator 442 to cross the detect threshold $V_{DET}$ repeatedly. This results in multiple transitions in data output signal thereby corrupting the data.

When the receiver is designed for positive feedback, as is receiver 420, the positive feedback reinforces the received signal, as demonstrated in FIG. 5C. The positive feedback, when combined with the received signal at $D_{IR}$, results in a signal at the input of comparator 442 that swings farther away from $V_{DET}$ responsive to the edges in $D_{IR}$ generating a single output pulse at $D_{OUT}$.

Bandpass filter 434 must be designed for good damped transient response to suppress signal ringing and overshoot. An example of a suitable filter is a Gaussian bandpass filter, which has roll-off edges in the signal output from the filter that have low ringing and overshoot transient response. In addition, the filter will temporally spread out the energy contained in the feedback spike. For example, a 20 nsec. spike is transformed into a 300 nsec. spike, which further contributes to the dynamic hysteresis discussed above.

However, in order to prevent AGC desensitization, the AGC threshold $V_{AGC}$ of receiver 420 needs to be set above the peak feedback value by a margin adequate to prevent the peak feedback value from causing the gain to be adjusted downward by the AGC. There are undesirable consequences of a high AGC threshold compared with a low AGC threshold. First, AGC noise quieting (which reduces signal interference from noise) is less effective. Secondly, the output pulse width will vary more with signal level.

AGC reduces the front end gain of amplifier 426 responsive to an increasing input signal on $D_{IR}$. Generally, in the absence of an input signal, amplifier 426 will be highly sensitive because the AGC permits the gain to be high. In the presence of noise, however, the AGC will reduce the gain in response to the input signal including the noise level. This improves the noise immunity of the receiver 420. The receiver will function so long as the received signal strength is greater than the amplitude of the noise. From a practical standpoint, in a noisy environment, this permits the sending and receiving devices to be moved closer together to strengthen the received signal and the communications link will be able to function. In the absence of AGC, the noise level will prevent the receiver from capturing the transmitted signal without corruption of the output data signal even when the transmitting device and receiver are close together because the noise signal will still have high enough amplitude to cause spurious output transitions in between valid output transitions.

Also, AGC improves the fidelity of the pulses in the data output $D_{OUT}$. Despite careful filter design, some ringing, overshoot and undershoot will still occur in the receiver. AGC reduces the effect of ringing, overshoot and undershoot when it reduces the sensitivity of amplifier 426. Further, because there is also ramping on the received waveform which can cause widening or narrowing of the signal pulse unless the detect threshold $V_{DET}$ is in the center of the waveform, AGC improves the fidelity of the pulse by maintaining $V_{DET}$ at the center of the waveform.

The amplitude of the positive feedback, however, also causes the AGC to adjust the receiver sensitivity downward. As the AGC reduces the gain in response to the positive feedback, the sensitivity of the receiver to the transmitted signal is also reduced and, particularly at high signal pulse rates, can cause the receiver to lose the input signal.

Whereas the circuit of FIG. 4 is effective in reducing the effects of feedback, it still suffers from the effect of feedback transient overshoot or ringing, which, if it exceeds the detect level $V_{DET}$, will cause undesirable extraneous output pulse transitions. Although the use of well known filter design techniques can limit transient overshoot to a negligible level, in practice, reducing it to a value below ⅕ or ⅒ the peak level is difficult due to variable phase shift effects both within and outside the infrared receiver. Some of these variable phase shift effects are due to normal variances in parameters such as transmit pulse shape, photodiode time constant, photodiode capacitance, receiver output load capacitance, receiver supply voltage, and filter component values.

Despite these limitations, receiver 420 can beneficially decrease the disruptive effects of feedback by 10 db–20 db for infrared receivers used with edge triggered, serial data communication controllers which do not need an accurate data pulse width or with receiver systems which do not require the benefits of a low threshold AGC.

Figure 6:
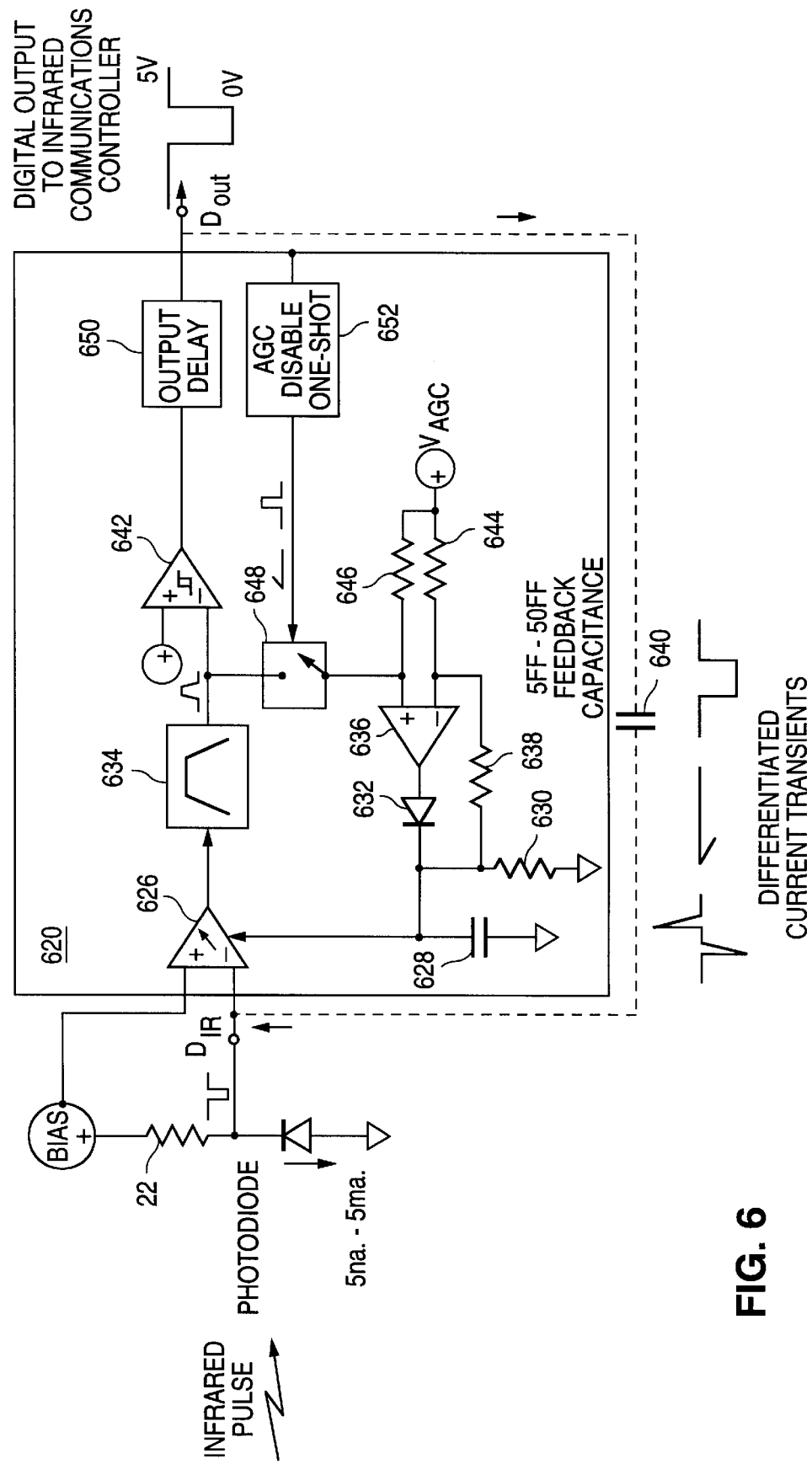
FIG. 6 is a circuit diagram of an embodiment of the present invention which utilizes an output delay and isolates the AGC circuit from the feedback signal.
Figures 7A, 7B, 7C:
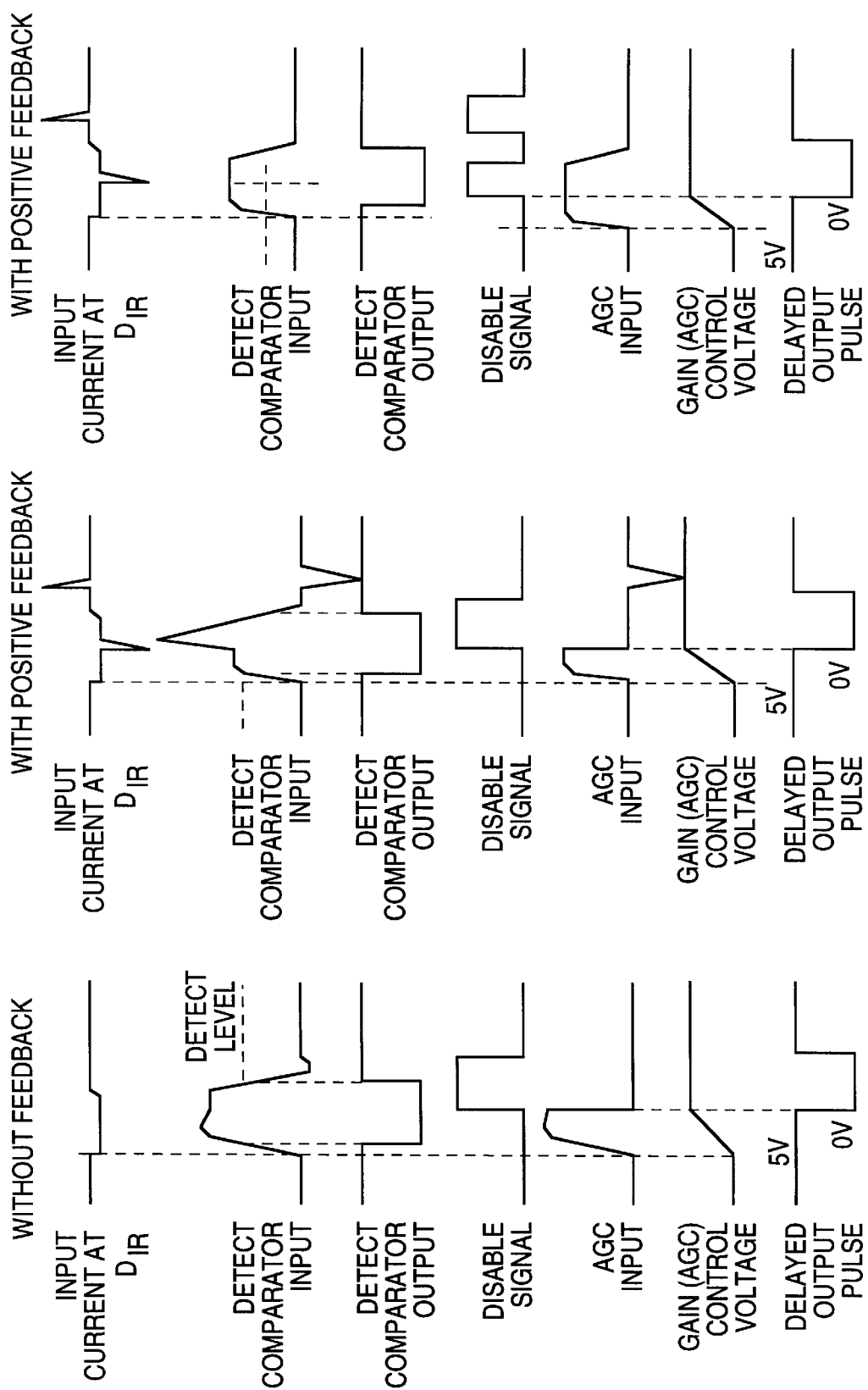
FIGS. 7A–C are waveform diagrams illustrating the behavior of the embodiment of the present invention shown in FIG. 6.

Another embodiment of the present invention is shown in FIG. 6. Infrared receiver 620, which is suitable for the use of low threshold AGC, adds delay 650 to the output signal from comparator 642, typically delaying the output by ½ of the pulse interval of the data signal to permit decay of the feedback pulse, as shown in FIG. 7A. Receiver 620 also includes a signal disable switch 648 controlled by AGC disable one-shot 652 which blocks the signal to the AGC input upon the leading edge of an output pulse transition on $D_{OUT}$.

By delaying the output signal, the peaks of the feedback signal from $D_{OUT}$ to $D_{IR}$ are shifted in time so that the feedback peak occurs toward the center of the pulse in the received signal at $D_{IR}$. Also, AGC disable one-shot 652 generates a signal disable pulse responsive to the falling edge in the output signal at $D_{OUT}$ which causes AGC disable switch 648 to open and isolate the input of AGC peak detector 636 from the received signal path for the duration of the signal disable pulse. The signal disable pulse must persist for a time interval sufficient for the feedback transient to settle below levels which would cause AGC gain reduction. AGC peak detector 636 is therefore isolated from the signal path at the time that the feedback pulse appears at the negative input to comparator 642. As a result, the gain control voltage stored in capacitor 628 during the disable period reflects the received signal strength and is not corrupted by the feedback signal.

Alternatively, the AGC disable one-shot 652 may be replaced with an output edge triggered disable one shot which will generate a disable pulse responsive to both the falling and rising edges of the output signal at $D_{OUT}$, as illustrated by the waveforms in FIG. 7C. An edge triggered disable will isolate the AGC peak detector 636 during feedback pulses for both the edges of the output pulse at $D_{OUT}$. This approach has the advantage that larger levels of feedback can be tolerated or the use of a low AGC threshold voltage level is permissible because the gain control voltage is not adversely affected by the feedback pulse from the rising edge of the output signal at $D_{OUT}$.

Whereas the performance of receiver 620 is substantially better than the performance of conventional receivers, it requires that receiver 620 be designed so that the feedback from $D_{OUT}$ to $D_{IR}$ is positive. Negative feedback will still cause spurious transitions in the output signal because the feedback is coupled to the input of comparator 642.

Figure 8:
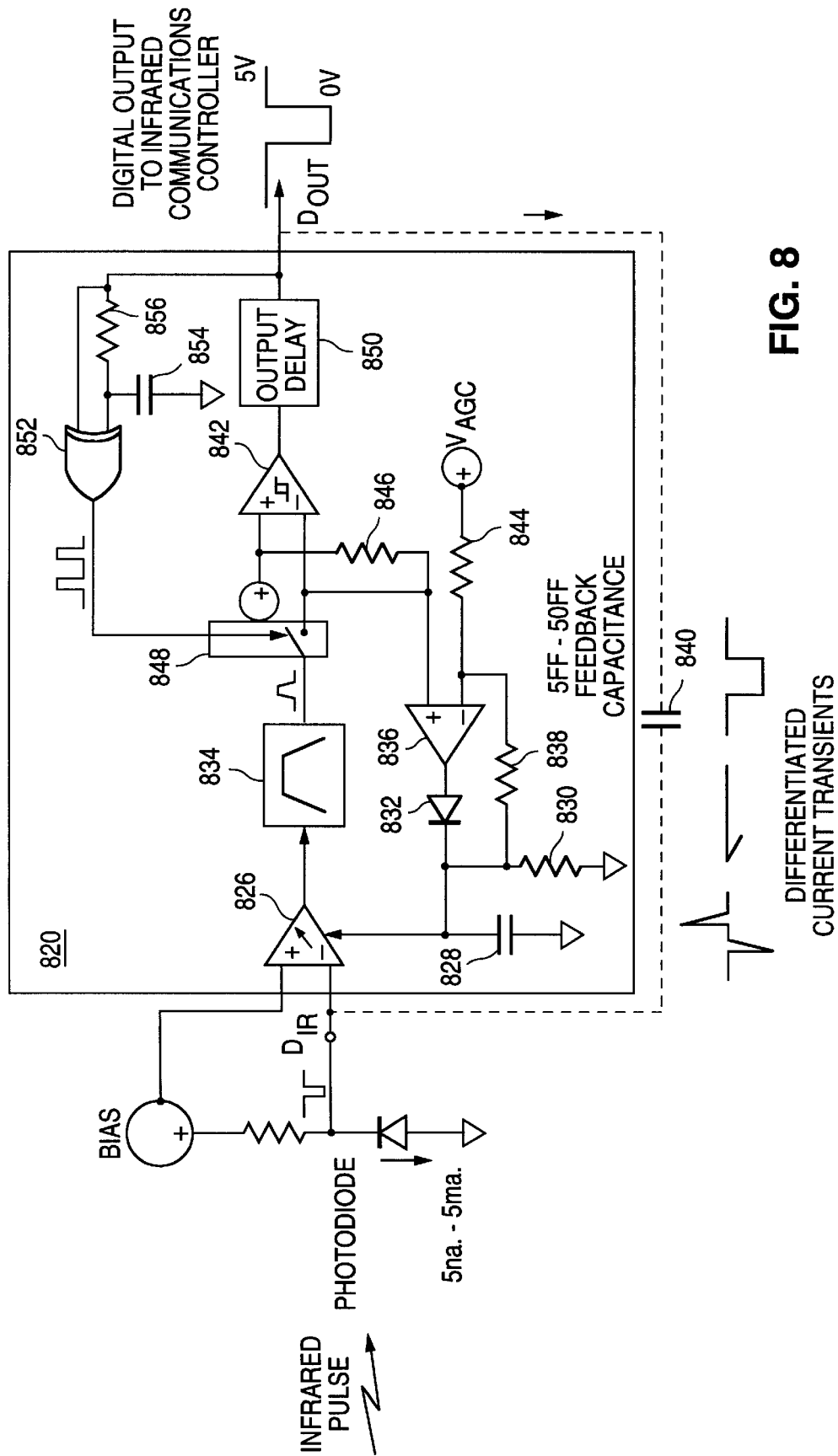
FIG. 8 is a circuit diagram of yet an embodiment of the present invention which also isolates the detect comparator from the feedback signal.

Receiver 820 of FIG. 8 shows yet another embodiment of the present invention which is not dependent upon positive feedback. Signal disable switch 848 is positioned between the output of bandpass filter 834 and the inputs of both comparator 842 and AGC peak detector 836. Output edge triggered disable one-shot 852 receives the delayed output signal at $D_{OUT}$ and generates a disable pulse responsive to each of the falling and rising edges of the output signal. The disable signal must persist for a period long enough for the feedback transients to decay below a level that would cause spurious transitions in the output signal from comparator 842. The disable pulses cause signal disable switch 848 to isolate comparator 842 and AGC peak detector 836 from the received signal path during the times when the falling and rising feedback peaks are present at the output of bandpass filter 834. This configuration permits receiver 820 to obtain the improved AGC performance of receiver 620. However, receiver 820 is not dependent upon positive feedback because the input of comparator 842 is isolated from the feedback peaks, thereby preventing the negative feedback peaks from causing spurious transitions in the output signal at $D_{OUT}$.

FIG. 8 also shows greater detail of an example of an output edge triggered disable one-shot. One input terminal of exclusive-OR gate 852 receives the output signal directly while the other input terminal is coupled to the output signal through resistor 756 and to ground through capacitor 854. Resistor 856 and capacitor 854 further delay the output signal such that, when a pulse edge occurs in the output signal, the two inputs of XOR 852 will be at different values for a time period determined by the RC constant of resistor 856 and capacitor 854, which therefore also determine the width of the disable pulses generated by XOR 852.

Figure 9:
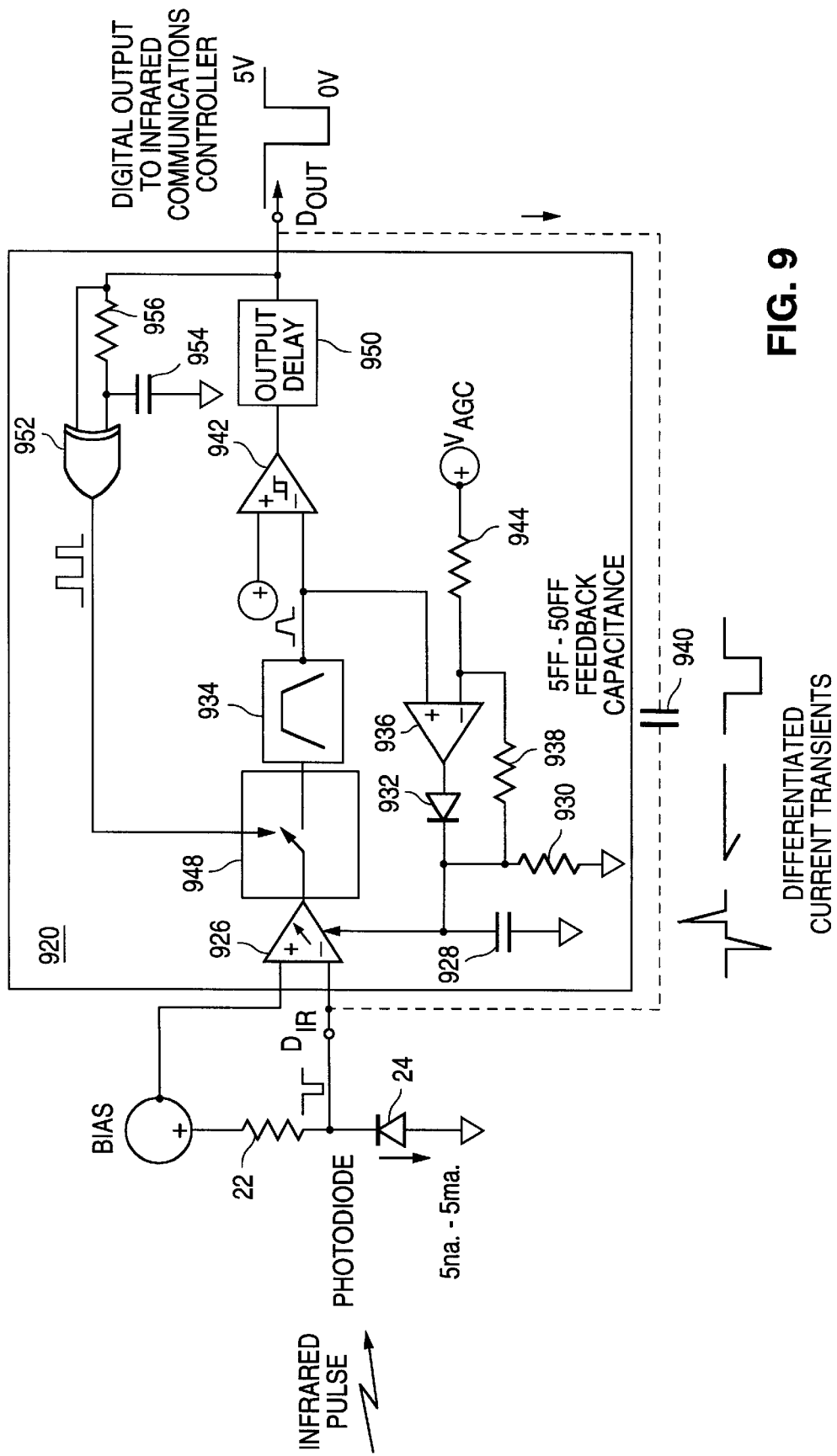
FIG. 9 is a circuit diagram of an embodiment of the present invention which also isolates the bandwidth filter from the feedback signal.

The high amplitude of the feedback pulses also contributes to ringing, overshoot and undershoot at the output of bandpass filter 834. Receiver 920 in FIG. 9 is constructed with signal disable switch 948 interposed between the output of input amplifier 926 and bandpass filter 934. This configuration permits the disable pulses generated by XOR 952 responsive to the edges in the output signal to isolate bandpass filter 934, comparator 942 and AGC peak detector 936 from the receive signal path feedback from $D_{OUT}$. This configuration causes the feedback transient to settle more rapidly because the transient is prevented from entering the bandpass filter 934 where the transient is prolonged due to the increase in ringing, overshoot and undershoot that would otherwise occur due to feedback transients in the output response of bandpass filter 934. This permits receiver 920 to tolerate larger amplitude feedback signals, use a narrower bandwidth to improve the signal to noise ratio of the receiver, or operate at faster pulse rates without corruption of the data output signal at $D_{OUT}$.

Because of variations in device tolerances and operating conditions, it is not possible to exactly predict when the feedback transients in the received signal path will settle. For slower communications formats, the duration of the disable pulses may be extended to account for variations in the settling time of the feedback peaks. However, faster communications formats, such as the 4 Mb/s format described above, have narrow windows because the data is related to the temporal position of the pulse which requires rapid settling times. As a result, the disable signal generated by XOR 952 may not coincide exactly with the feedback peaks.

For example, if the disable signal is 1.5 us, then valid input signal transitions which have less than 1.5 us between them cannot be detected. To capture these signal transitions, it is necessary to set the disable signal duration to the minimum required to prevent feedback disruption. However, due to variances in IC timing circuit tolerances and variances in feedback due to variances in receiver packages and circuit board trace layout, it becomes necessary to set the signal disable period to a larger value than is typically required so as to ensure that most receivers will function without feedback disruption. This adds a difficult engineering burden of correctly determining the optimum signal disable duration and undesirable limiting maximum pulse rate on receiver packages or board layouts which have low feedback levels.

Figure 10:
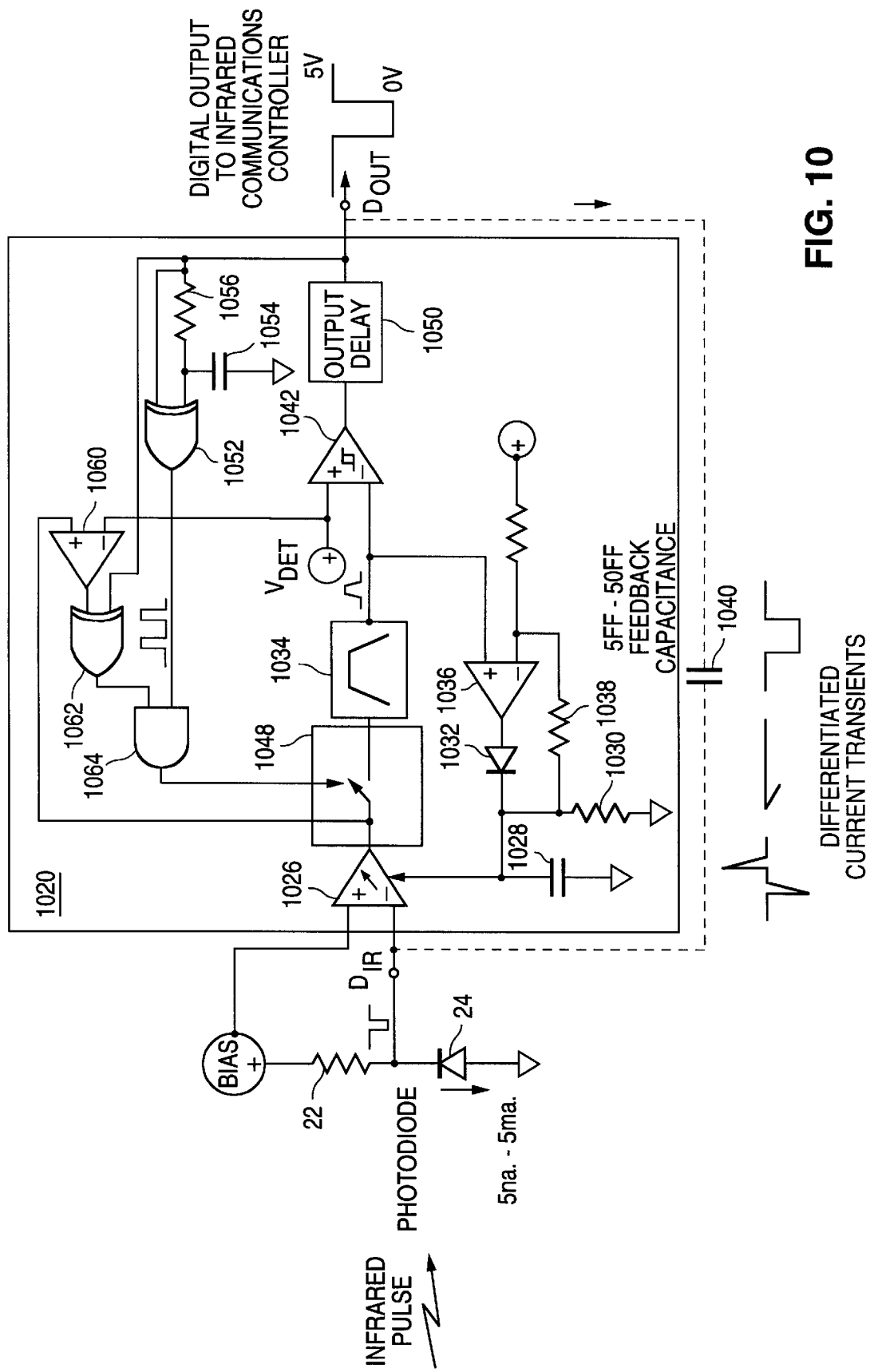
FIG. 10 is a circuit diagram of an embodiment of the present invention which monitors the receive signal path and controls the isolation signal responsive to the settling time of the feedback transient.

To accommodate faster communications formats and address variation in signal settling, receiver 1020 in FIG. 10 is designed with positive feedback and feedback detection which monitors the feedback transients and prevents signal disable switch 1048 from closing while a feedback transient is present.

Feedback detect comparator 1060 compares the amplified input data signal at the output of input amplifier 1026 to the detection threshold voltage level $V_{DET}$ and outputs a high level signal so long as the amplified input signal is greater that the detection threshold. Exclusive-OR 1062 compares the output of the feedback detect comparator 1060 with the delayed digital output signal and outputs a high level signal if the two signals differ. Conversely, exclusive-OR 1062 outputs a low level if the two signals are in agreement. This low output signal will propagate through AND gate 1064 to close signal disable switch 1048 before the edge triggered disable signal output from exclusive-OR 1052 would normally cause switch 1048 to close. This permits receiver 1020 to operate at higher speeds when the transient settling time is faster than that predicted solely by the timing of the edge-triggered one shot circuit.

Figure 11:
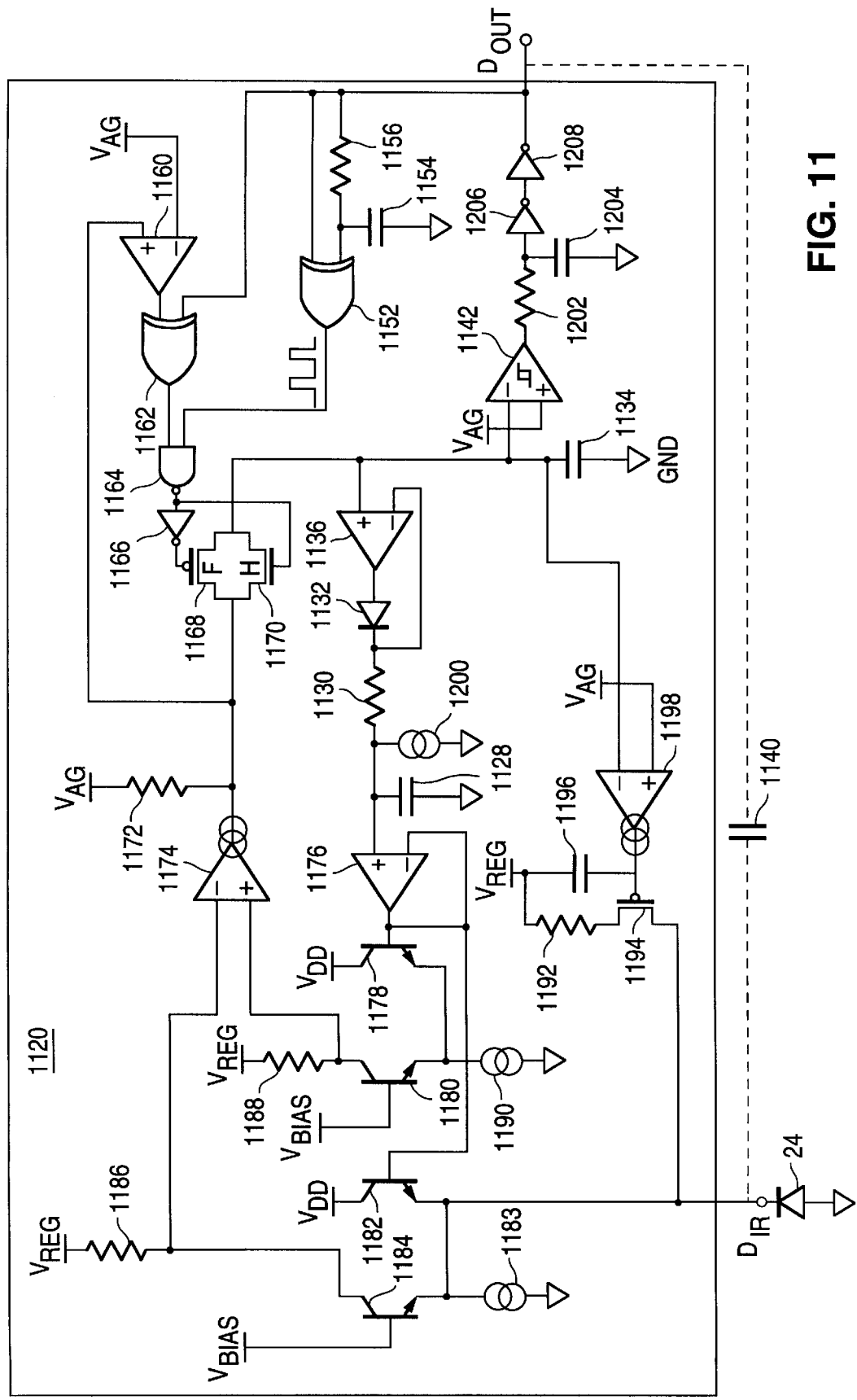
FIG. 11 is a circuit diagram of an embodiment of the present invention which includes additional detail of the circuit design.

The receiver 1120 of FIG. 11 illustrates the detailed circuit design for an embodiment of the present invention. The input amplifier stage for receiver 1120 is constructed from transistors 1178, 1180, 1182 and 1184. The gain control voltage accumulated on capacitor 1128 passes through gain control buffer 1176 and varies the amount of current shunted from voltage source $V_{DD}$ through transistors 1178 and 1182. If more current is shunted through transistors 1178 and 1182, then more of the current signal received at $D_{IR}$ is diverted through transistor 1182 and a correspondingly attenuated current signal passes through transistor 1184. Conversely, a lower gain control voltage will result in less current diverted through transistor 1182 and therefore more current is available for passage of a less attenuated received current signal through transistor 1184.

The infrared current signal received at $D_{IR}$ from photodiode 24 modulates the current running through transistor 1184 to generate the voltage signal appearing at the negative input terminal of wideband transconductance amplifier 1174. The amplified received signal output from amplifier 1174 appears at the source terminals of pass gate transistors 1168 and 1170 which function as an isolation switch which is controlled by the isolation control signal generated at the output of NAND gate 1164. Thus, pass gate transistors 1168 and 1170 permit the received signal to pass through to AGC peak detector 1136, bandpass filter capacitor 1134 and comparator 1142 when the output from either XOR 1162 or XOR 1152 is low and otherwise isolates these components. The output of feedback detect comparator 1160 will go low once a feedback transient present at the output of amplifier 1174 has decayed below the analog reference voltage $V_{AG}$ (otherwise known as an analog ground), which is a stable voltage potential, typically at approximately the center of the range between $V_{DD}$ and the ground potential, which is used to bias the amplifiers of receiver 1120 at approximately the center of their operating range. DC and AC correction transconductance amplifier 1198 monitors $V_{AG}$ and shunts current from a regulated voltage source $V_{REG}$ to compensate for the DC and AC ambient currents produced by photodiode 24 and also to correct for bias offset errors of the components of receiver 1120. The digital data output signal generated by comparator 1142 in response to the input data signal received at $D_{IR}$ is delayed by the RC constant formed by resistors 1202 and capacitor 1204 as well as the gate delays introduced by inverters 1204 and 1206 in order to obtain the delayed digital output data signal which is presented at $D_{out}$.

Having illustrated and described the principles of the present invention in the context of the embodiments described above, it should be readily apparent to those skilled in the art that the invention can be modified in arrangement and detail without departing from such principles. For example, while the present invention is described above in the context of an infrared receiver, it should be readily understood that the present invention is applicable to other signal receivers without departing from the scope and spirit of the present invention.

I claim:

1. A method for suppressing feedback effects in a receiver, the method comprising the steps of:
    amplifying an input signal to produce an amplified input signal;
    controlling the gain of the input signal amplification responsive to the magnitude of the amplified input signal;
    comparing the amplified input signal to a detection threshold voltage to produce a digital data signal; and
    holding the gain at a substantially constant level in response to a fast signal transition in the digital output signal.

2. The method of claim 1 including the step of filtering the amplified input signal to produce a filtered input signal.

3. The method of claim 1 wherein:
    the step of controlling the gain of the input signal amplification responsive to the magnitude of the amplified input signal includes the step of controlling the gain using an automatic gain control circuit; and
    the step of holding the gain at a substantially constant level includes the steps:
        generating an isolation signal responsive to the digital data signal, and
        isolating the automatic gain control circuit from the amplified input signal responsive to the isolation signal.

4. The method of claim 3 wherein the step of comparing the amplified input signal to a detection threshold voltage includes using a comparator circuit to compare the amplified input signal to the detection threshold voltage and further including the step of isolating the comparator from the amplified input signal responsive to the isolation signal.

5. The method of claim 3 including:
    filtering the amplified input signal using a bandpass filter to produce a filtered input signal; and
    isolating the bandpass filter from the amplified input data signal responsive to the isolation signal.

6. The method of claim 3 wherein the step of generating an isolation signal includes generating a pulse of a predetermined duration responsive to each falling edge in a delayed version of the digital data signal.

7. The method of claim 3 wherein the step of generating an isolation signal includes generating a pulse of a predetermined duration responsive to each edge in a delayed version of the digital data signal.

8. The method of claim 1 wherein the step of comparing the filtered input signal to a detection threshold voltage to produce a digital data signal includes the step of introducing a time delay to the digital data signal.

9. A receiver circuit comprising:
    an input amplifier having first and second input terminals, a gain control terminal and an output terminal, the first input terminal being configured to receive a first bias voltage and the second input terminal being configured to receive an input data signal;
    a bandpass filter having input and output terminals, the input terminal being coupled to the output terminal of the input amplifier;
    a comparator having first and second input terminals and an output terminal, the first input terminal being configured to receive a detection threshold voltage, the second input terminal being coupled to the output of the bandpass filter, and the output terminal being coupled to an output terminal of the receiver circuit;
    an automatic gain control circuit having first and second input terminals and an output terminal, the first input terminal being coupled to the output of the bandpass filter, the second input terminal being configured to receive an automatic gain control threshold voltage, and the output terminal being coupled to the gain control terminal of the input amplifier;
    a delay circuit having input and output terminals, wherein the input terminal is coupled to the output terminal of the comparator such that an output data signal is generated at the output terminal of the delay circuit responsive to the input data signal;
    an isolation control signal generator having input and output terminals, wherein the input terminal is coupled to the output terminal of the delay circuit, and wherein the isolation control signal generator is configured to generate a pulse of predetermined duration at its output terminal responsive to an edge in the output data signal; and
    an isolation switch having input, output and control terminals, the control terminal being coupled to the output terminal of the isolation control signal generator such that the isolation switch isolates the input terminal thereof from the output terminal thereof responsive to the automatic gain control signal, the input terminal of the isolation switch being coupled to the output terminal of the input amplifier, the output terminal of the isolation switch being coupled to the first input terminal of the automatic gain control circuit such that the isolation switch is interposed between the first input terminal of the automatic gain control circuit and the output terminal of the input amplifier whereby the isolation switch isolates the automatic gain control circuit from the output terminal of the input amplifier responsive to the isolation control signal.

10. The receiver of claim 9 wherein the output terminal of the isolation switch is further coupled to the second input terminal of the comparator such that the isolation switch is interposed between the second input terminal of the comparator and the output terminal of the input amplifier whereby the isolation switch isolates the comparator from the output terminal of the input amplifier responsive to the isolation control signal.

11. The receiver of claim 10 wherein the output terminal of the isolation switch is further coupled to the input terminal of the bandpass filter such that the isolation switch is interposed between the input terminal of the bandpass filter and the output terminal of the input amplifier whereby the isolation switch isolates the bandpass filter from the output terminal of the input amplifier responsive to the isolation control signal.

12. The receiver of claim 11 wherein the isolation control signal generator comprises a one-shot circuit configured to generate an output pulse of a predetermined duration at the output terminal responsive to a falling edge in the output of the delay circuit.

13. The receiver of claim 11 wherein the isolation control signal generator comprises an edge triggered one-shot circuit configured to generate an output pulse of a predetermined duration at the output terminal responsive to each edge in the output of the delay circuit.

14. The receiver of claim 13 wherein the edge triggered one-shot circuit comprises:
    a first exclusive-OR gate having first and second input terminals and an output terminal, the first input terminal being coupled to the output terminal of the delay circuit and the output terminal being coupled to the control terminal of the isolation switch;

a resistor having first and second terminals, the first terminal being coupled to the output terminal of the delay circuit, and the second terminal being coupled to the second input terminal of the first exclusive-OR gate; and a capacitor coupled between the second input terminal of the first exclusive-OR gate and ground;

whereby the first exclusive-OR gate generates the isolation control signal at its output terminal responsive to the output of the delay circuit.

15. The receiver of claim 14 wherein the isolation control signal generator further includes:

a feedback detect comparator having first and second input terminals and an output terminal, the first input terminal being coupled to the output terminal of the input amplifier, and the second input terminal being configured to receive the detection threshold voltage;

a second exclusive-OR gate having first and second input terminals and an output terminal, the first input terminal being coupled to the output terminal of the feedback detect comparator, and the second input terminal being coupled to the output terminal of the delay circuit; and an AND gate having first and second input terminals and an output terminal, the first input terminal being coupled to the output terminal of the first exclusive-OR gate, the second input terminal being coupled to the output terminal of the second exclusive-OR gate, and the output terminal being coupled to the control terminal of the isolation switch.

16. The receiver of claim 9 wherein the output terminal of the isolation switch is further coupled to the input terminal of the bandpass filter such that the isolation switch is interposed between the input terminal of the bandpass filter and the output terminal of the input amplifier whereby the isolation switch isolates the bandpass filter from the output terminal of the input amplifier responsive to the isolation control signal.

17. A receiver circuit comprising:

a circuit input terminal for receiving an input signal;

a circuit output terminal;

an input amplifier interposed between the circuit input and output terminals, the input amplifier being configured to receive and amplify the input signal to produce an amplified input signal, and wherein the input amplifier is further configured to vary the gain of the input amplifier responsive to a gain control signal;

a bandpass filter interposed between the input amplifier and the circuit output terminal, the bandpass filter being configured to receive and bandpass filter the amplified input signal so as to produce a filtered input signal;

a comparator interposed between the bandpass filter and the circuit output terminal, the comparator being configured to compare the filtered input signal to a detection threshold voltage level in order to generate a digital output signal;

a delay circuit interposed between the comparator and the circuit output terminal, the delay circuit being configured to receive the digital output signal and generate a delayed digital output signal responsive thereto;

an automatic gain control circuit configured to receive the filtered input signal, the automatic gain control circuit comparing the filtered input signal to an automatic gain control threshold voltage and generating the gain control signal responsive thereto;

an isolation control signal generator configured to receive the delayed digital output signal and generating an isolation control signal responsive thereto; and an isolation switch interposed between the input amplifier and the automatic gain control circuit, the isolation switch being configured to receive the isolation control signal and, responsive thereto, isolate the automatic gain control circuit from the amplified input signal.

18. The receiver circuit of claim 17 wherein the isolation switch is further configured to isolate the comparator from the amplified input signal responsive to the isolation control signal.

19. The receiver circuit of claim 17 wherein the isolation switch is further configured to isolate the bandpass filter from the amplified input signal responsive to the isolation control signal.

20. The receiver of claim 17 wherein the isolation control signal generator comprises a one-shot circuit configured to generate an output pulse of a predetermined duration responsive to a falling edge in the delayed digital output signal.

21. The receiver of claim 17 wherein the isolation control signal generator comprises an edge triggered one-shot circuit configured to generate an output pulse of a predetermined duration responsive to each edge in the delayed digital output signal.

22. The receiver of claim 21 wherein the edge triggered one-shot circuit comprises:

a first exclusive-OR gate having first and second input terminals and an output terminal, wherein the first input terminal is configured to receive the delayed digital output signal;

a resistor having first and second terminals, wherein the first terminal is configured to receive the delayed digital output signal, and further wherein the second terminal is coupled to the second input terminal of the first exclusive-OR gate; and a capacitor coupled between the second input terminal of the first exclusive-OR gate and ground;

whereby the first exclusive-OR gate generates the isolation control signal at its output terminal responsive to the delayed digital output signal.

23. The receiver of claim 22 wherein the isolation control signal generator further includes:

a feedback detect comparator configured to receive the amplified input signal and compare it to the detection threshold voltage level to produce a feedback detect signal;

a second exclusive-OR gate having first and second input terminals and an output terminal, wherein the first input terminal is configured to receive the feedback detect signal and the second input terminal is configured to receive the delayed digital output signal; and an AND gate having first and second input terminals and an output terminal, wherein the first input terminal is coupled to the output terminal of the first exclusive-OR gate and the second input terminal is coupled to the output terminal of the second exclusive-OR gate whereby the AND gate generates the isolation control signal at its output terminal.

* * * * *